United States Patent [19]
Chang et al.

[11] Patent Number: 5,909,392
[45] Date of Patent: Jun. 1, 1999

[54] PMOS MEMORY ARRAY HAVING OR GATE ARCHITECTURE

[75] Inventors: Shang-De Ted Chang, Fremont; Chinh D. Nguyen; Guy S. Yuen, both of San Jose; Chi-Tay Huang, Fremont, all of Calif.

[73] Assignee: Programmable Microelectronics Corporation, San Jose, Calif.

[21] Appl. No.: 08/948,531

[22] Filed: Oct. 9, 1997

[51] Int. Cl.[6] .................................................. G11C 16/04
[52] U.S. Cl. .............................. 365/185.12; 365/185.13; 365/185.17; 365/185.18; 365/185.29
[58] Field of Search ...................... 365/185.12, 185.13, 365/185.17, 185.29, 185.18

[56] References Cited

U.S. PATENT DOCUMENTS

| | | |
|---|---|---|
| 5,365,484 | 11/1994 | Cleveland et al. .................. 365/218 |
| 5,422,843 | 6/1995 | Yamada ................................. 365/185 |
| 5,581,504 | 12/1996 | Chang ................................. 365/185.17 |
| 5,796,656 | 8/1998 | Kowshik et al. .................. 365/185.23 |
| 5,801,994 | 9/1998 | Chang et al. ...................... 365/185.29 |

*Primary Examiner*—David Nelms
*Assistant Examiner*—Tuan T. Nguyen
*Attorney, Agent, or Firm*—Flehr Hohbach Test Albritton & Herbert LLP

[57] ABSTRACT

A nonvolatile PMOS memory array includes a plurality of pages, where each column of a page includes two series-connected PMOS OR strings in parallel with a bit line. Each PMOS OR string includes a PMOS select transistor coupled between the bit line and two series connected PMOS floating gate memory cells. The PMOS floating gate memory cells are programmed via channel hot electron (CHE) injection and erased via electron tunneling. A soft-program mechanism is used to compensate for over-erasing of the memory cells. In some embodiments, the bit lines are segmented along page boundaries to increase speed.

20 Claims, 3 Drawing Sheets

PMOS MEMORY ARRAY HAVING OR GATE ARCHITECTURE

CROSS REFERENCE TO RELATED APPLICATIONS

This application is related to the commonly owned U.S. patent applications Ser. No. 08/948,147 entitled "Apparatus and Method For Programming PMOS Memory Cells" and Ser. No. 08/947,850 entitled "Nonvolatile PMOS Two Transistor Memory Cell and Array", both filed on the same day as the present application.

BACKGROUND

1. Field of Invention

This invention relates generally to semiconductor memories and specifically to an array architecture for housing non-volatile PMOS floating gate memory cells.

2. Description of Related Art

Flash EEPROM, which combines the advantages of EPROM density and EEPROM erasability, is becoming increasing popular in the semiconductor memory market. Traditionally, flash EEPROM, as well as EPROM and EEPROM, has been fabricated using NMOS technology due to the superior mobility of electrons over holes. EPROM cells are programmed via electron tunneling and erased using ultraviolet radiation, while EEPROM cells are programmed and erased via electron tunneling.

FIG. 1 illustrates a conventional NMOS flash memory cell 10. A p− substrate 12 has an n+ source 14 and an n+ drain 16 formed therein. A channel 18 extends within substrate 12 between the n+ source 14 and the n+ drain 16. A thin gate dielectric layer 20 separates a polysilicon floating gate 22 from the substrate 12. The gate dielectric 20 may be, for instance, a layer of silicon dioxide ($SiO_2$) having a thickness of approximately 100 Å. A second dielectric layer 24 separates a control gate 26 from the floating gate 22. Although not illustrated in FIG. 1, a protective insulating layer is typically formed over the Flash EEPROM cell 10, and electrical contacts are made to the n+ source 14, the n+ drain 16, and the control gate 26.

To program the cell 10, approximately 5 volts and 12 volts are applied to the drain 16 and control gate 26, respectively, for a few milliseconds, while the source 14 is held at a low potential, e.g., ground potential. In response thereto, electrons accelerate across the channel 18 and, colliding with electrons and lattice atoms proximate the drain 16, generate hot electrons. The hot electrons are attracted to the high positive voltage on the control gate 26 and are injected into the floating gate 22. The resulting accumulation of negative charge within the floating gate 22 increases the threshold voltage of the cell 10, thereby programming the cell 10.

The cell 10 is erased by floating the drain 16, grounding the control gate 26, and applying approximately 12 volts to the source 14. Electrons within the floating gate 22 tunnel through the gate dielectric 20 and into the source 14, thereby restoring the threshold voltage to its original level and, thus, erasing the cell 10.

To read the cell 10, the source 14 is grounded, the drain 16 is held at approximately between 1 and 2 volts, and the control gate 26 is held at approximately 5 volts. Under these bias conditions, the cell 10 will conduct a channel current only if in an erased state.

Technological improvements have led to the development of a PMOS Flash EEPROM cell, as disclosed in the co-pending and commonly owned U.S. patent application Ser. No. 08/557,589 entitled "PMOS Memory Cell with Hot Electron Injection Programming and Tunneling Erasing," filed on Nov. 14, 1995, issued to Chang on Nov. 11, 1997 as U.S. Pat. No. 5,687,118. FIG. 2 illustrates a PMOS floating gate memory cell 30 of the type disclosed in the Chang patent. The cell 30 is formed in an n− well region 32 of a p− substrate 34. A p+ source 36 and a p+ drain 38 are formed in the n− well region 32. A channel 40 extends within the n− well 32 between the p+ source 36 and the p+ drain 38. A polysilicon floating gate 42 is insulated from the n− well region 32 by a thin tunnel oxide layer 44. Preferably, the oxide layer 44 is approximately between 80–130 Å thick and extends over the entire length of channel 40 and portions of both the p+ source 36 and the p+ drain 38. A control gate 46 is insulated from the floating gate 42 by an insulating layer 48.

In some embodiments, the cell 30 is programmed by applying approximately 6.5 volts to the p+ source 36, pulling the p+ drain 38 to between 0 and 2 volts, and coupling a program voltage which ramps from a first potential to a second potential to the control gate 46. Positively charged holes accelerate across the channel 40 towards the p+ drain 38. These holes collide with electrons and lattice atoms in a drain depletion region 50 proximate the p+ drain 38 and result in impact ionization. High energy electrons generated from the impact ionization are attracted to the ramped voltage on the control gate 46 and are injected into the floating gate 42. The resulting accumulation of negative charge on the floating gate 42 increases the threshold voltage of the cell 30, thereby programming the cell 30. This programming mechanism is known as channel hot electron (CHE) injection.

In other embodiments, the cell 30 is programmed by applying a constant positive potential to the control gate 46 to cause the injection of hot electrons, induced by band-to-band tunneling, into the floating gate 46.

The cell 30 is erased by applying approximately 9 volts to the p+ source 36 and to the n− well 32, pulling the control gate 46 to approximately −9 volts, and floating the p+ drain 38. Electrons within the floating gate 42 tunnel through the gate oxide layer 44 and into the p+ source 36, the p+ drain 38, and the channel 40 of the cell 30, thereby returning the threshold voltage of the cell 30 to its intrinsic level. This erasing technique is known as a channel erase.

The cell 30 is read by applying a supply voltage $V_{CC}$ to the p+ source 36 and the n− well 32. The control gate 46 is coupled to a potential between ground potential and $V_{CC}$, and the p+ drain 38 is coupled to a voltage slightly less than $V_{CC}$. Under these bias conditions, the cell 30 conducts a channel current only if in a programmed state, i.e., only if the floating gate 42 is charged. Thus, unlike conventional NMOS memory cells, the PMOS cell 30 does not suffer from read disturb problems.

The PMOS flash cell 30 is advantageous in numerous ways over conventional NMOS memory cells. For a detailed discussion of such advantages, refer to the above-mentioned Chang patent, incorporated herein by reference. Because such PMOS memory cells require different bias conditions during programming, erasing, and reading operations, conventional array architectures designed for NMOS floating gate memory cells are not always suitable for PMOS floating gate memory cells. Accordingly, there exists a need for an array architecture which optimizes the performance of PMOS floating gate memory cells.

SUMMARY

A novel array architecture is disclosed herein which optimizes the performance of PMOS floating gate memory cells. In accordance with the present invention, a memory array is disclosed having a plurality of pages, where each column of a page includes two series-connected PMOS OR strings in parallel with a bit line. Each PMOS OR string includes a PMOS select transistor coupled between the bit line and two series connected PMOS floating gate memory cells. The PMOS floating gate memory cells are programmed via channel hot electron (CHE) injection and erased via electron tunneling. A soft-program mechanism is used to compensate for over-erasing of the memory cells. In some embodiments, the bit lines are segmented along page boundaries to increase speed.

Like components in the Figures are similarly labeled.

DETAILED DESCRIPTION

Embodiments of the present invention are discussed below in the context of a PMOS floating gate memory cell of the type disclosed in the above-referenced Chang patent for simplicity only. It is to be understood that present embodiments may employ other suitable PMOS memory cells. Accordingly, present embodiments are not to be construed as limited to the specific examples discussed herein.

Figure 1:
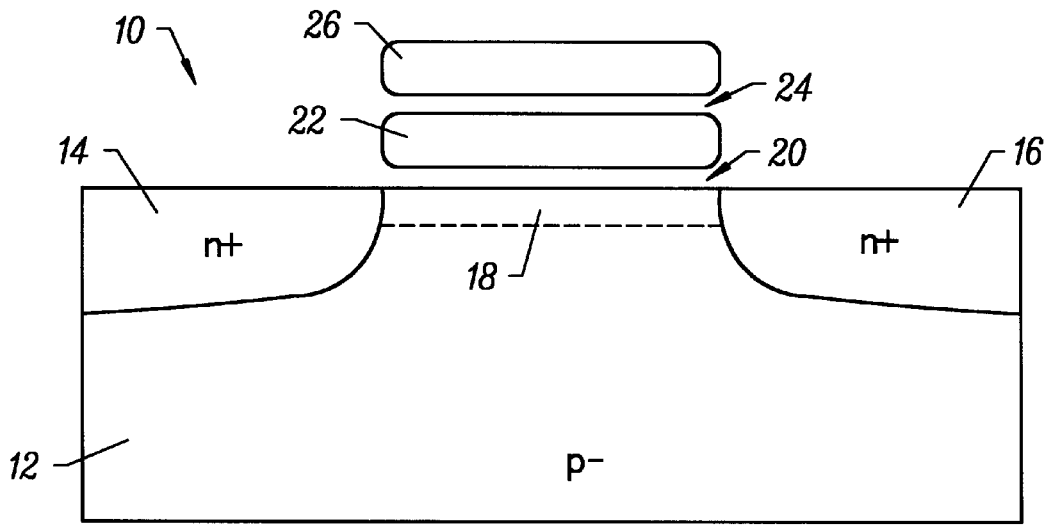
FIG. 1 is a schematic diagram of a NMOS floating gate memory cell in accordance with the prior art.
Figure 2:
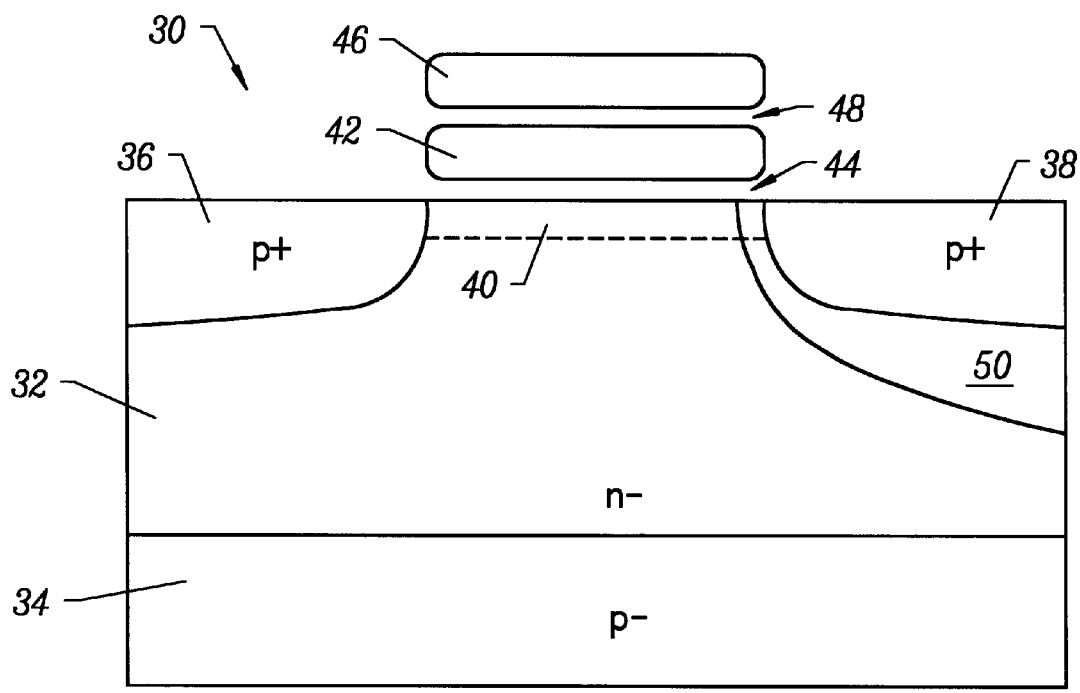
FIG. 2 is a schematic diagram of a PMOS floating gate memory cell in accordance with the above-referenced Chang patent.
Figure 3:
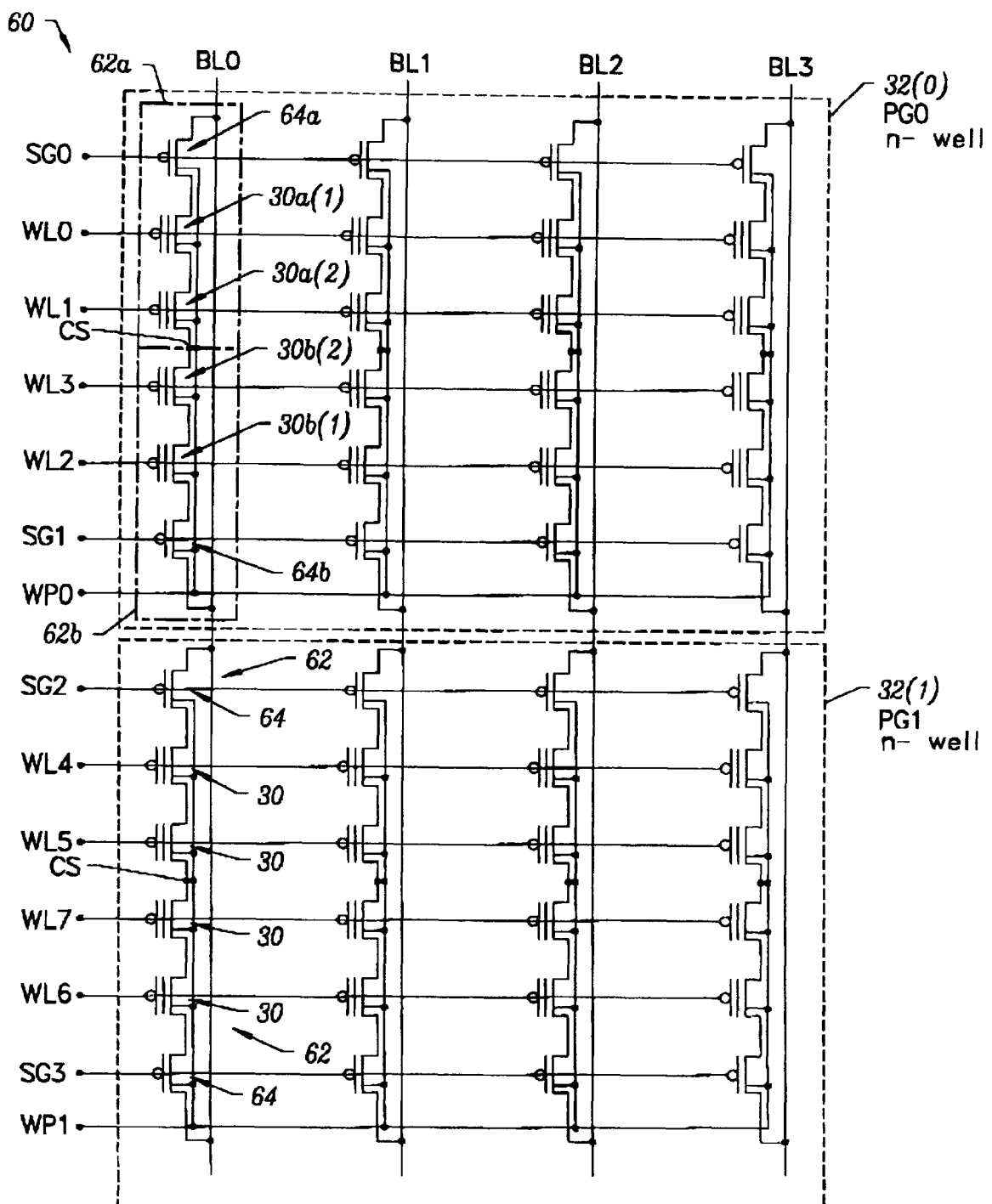
FIG. 3 is schematic diagram of a PMOS array architecture in accordance with one embodiment of the present invention.

Referring to FIG. 3, the Flash EEPROM array 60 is shown to include two pages PG0 and PG1 of the memory cells 30 (see also FIG. 2). In preferred embodiments, the cells 30 within each page are formed in an associated n− well region. For instance, the memory cells 30 within page PG0 of the array 60 are formed in a first n− well region 32(0) and the memory cells 30 within page PG1 of the array 60 are formed in a second n− well region 32(1), where both n− well regions are formed in a common p− substrate. Each n− well region is coupled to an associated well potential line WP. For instance, the n− well region 32(0) of page PG0 is coupled to the well potential line WP0, and the n− well region 32(1) of page PG1 is coupled to the well potential line WP1. In this manner, the respective n− well regions 32 of the pages of the array 60 may be held at different potentials. The advantages resulting from the ability to hold the respective n− well regions at different potentials are discussed in detail below.

Each page includes a plurality of columns, where each page column includes a pair of PMOS OR strings 62 connected in series with one another and in parallel to a bit line BL. Each OR string 62 includes a PMOS select transistor 64 coupled between the bit line BL and two series-connected PMOS memory cells 30. The gates of the select transistors 64 lying in a common row are coupled to a select gate line SG. The control gates of the memory cells 30 in a common row are coupled to a word line WL.

For instance, the first column of the page PG0 is formed by the OR strings 62a and 62b, where the OR string 62a includes the PMOS select transistor 64a and PMOS cells 30a(1) and 30a(2), and the OR string 62b includes the PMOS select transistor 64b and the PMOS cells 30b(1) and 30b(2). Specifically, the p+ drain 38 of the select transistor 64a is coupled to the bit line BL0, and the memory cells 30a(1) and 30a(2) are connected in series between the source of the select transistor 64a and a common source node CS which, as shown in FIG. 3, is tied to the well potential line WP0. In a similar manner, the drain of the select transistor 64b is coupled to the bit line BL0, and the memory cells 30b(1) and 30b(2) are connected in series between the source of the select transistor 64b and the common source node CS. The sources of all PMOS cells within a page are coupled to the n− well region 32 of that page. Thus, the sources of the PMOS cells 30 in the page PG0 are coupled to the well potential line WP0, and the sources of the PMOS cells 30 in the page PG1 are coupled to the well potential line WP1. In other embodiments, the sources of the PMOS cells 30 in each page are not coupled to the n− well region of that page, thereby allowing the common source node CS and the n− well region potential of a page to be held at different potentials.

As shown in FIG. 3, each page of the array 60 includes four columns of the PMOS cells 30, for a total of sixteen PMOS cells 30 per page. In actual embodiments, the array 60 may be configured to have a greater or fewer number of pages, and the size of each page, e.g., the number of columns within each page, may vary, depending upon silicon size and other desired parameters. Further, in other embodiments the OR strings 62 may include more than two memory cells 30, again depending upon a desired configuration. Although allowing for greater device integration, increasing the number of memory cells in each OR string 62 increases the capacitance of the bit lines BL which, in turn, reduces speed. Thus, where a high device density is of primary concern, it may be desirable for the OR string 62 to include more than two PMOS cells 30. Where, on the other hand, access speed is most important, each OR string 62 should include only two PMOS cells 30.

Programming Operations

To program a selected cell within the page PG0 such as, for instance, the cell 30a(1), a positive potential of approximately 9 volts is applied to the selected n− well region 32(0) while the unselected n− well region 32(1) is floating. The selected bit line BL0 is grounded, and all unselected bit lines BL1–BL3 are floating. The select gate line SG0 is grounded, thereby turning on the select transistor 64a. All other select gate lines SG1–SG3 are held at approximately 10.5 volts, thereby ensuring that the respective select transistors 64 coupled thereto remain off so as to isolate the unselected cells from the selected bit line BL0. The unselected word line WL1 is grounded to allow a channel current to flow in the memory cell 30a(2) irrespective of whether the cell 30a(2) is programmed. All other unselected word lines WL2–WL7 are held at approximately 10.5 volts, thereby preventing the respective memory cells 30 coupled thereto from conducting a channel current.

A program voltage $V_P$ is applied to the selected word line WL0. In preferred embodiments, the program voltage $V_P$ ramps from a first potential such as, for instance, approximately 7 volts, to a second potential such as, for instance, approximately 10.5 volts. Under these bias conditions, the program voltage $V_P$ induces the injection of channel hot electrons (CHE) into the floating gate 42 of the selected cell 30a(1) as described above with respect to FIG. 2, thereby programming the selected cell 30a(1).

In some embodiments, the program voltage $V_P$ is a constant voltage between approximately 8 and 10 volts. In such embodiments, hot electrons are generated by band-to-band tunneling (BTBT) near the p+ drain 38 of the selected cell 30 and are subsequently injected into the floating gate of the selected cell 30. In other embodiments, programming voltages of the type disclosed in the commonly owned and co-pending U.S. patent application Ser. No. 08/948,147 entitled Apparatus and Method For Programming PMOS Memory Cells are used to program the memory cells 30 of the array 60. In still other embodiments, programming techniques of the type disclosed in U.S. Pat. No. 5,687,116 issued to Kowshik on Nov. 11, 1997 may be used to program the memory cells 30.

The absence of the programming voltage $V_P$ on the word line WL1, as well as the absence of a voltage differential between the p+ source 36 and p+ drain 38 of the memory cell 30a(2), precludes programming of the memory cell 30a(2). Floating the unselected bit lines prevents programming of the memory cells 30 in columns associated with the unselected bit lines, while the absence of the program voltage $V_P$ on the unselected word lines prevents programming of the memory cells in rows associated with the unselected word lines. In addition, floating the unselected n– well region 32(1) prevents programming of the cells 30 in the page PG1. In this manner, holding the selected n– well region 32(0) and the unselected n– well region 32(1) at different potentials isolates the cells 30 in the page PG1 from programming operations on the selected page PG0.

The bias conditions for programming the selected cell 30a(1) are summarized below in Table 1.

TABLE 1

Programming Voltages

| node | voltage |
|---|---|
| SG0 | 0 |
| all other select gates, | 10.5 ± 0.5 volts |
| WL0 | $V_p$ |
| WL1 | 0 |
| all other words lines | 10.5 ± 0.5 volts |
| BL0 | 0 |
| all other bit lines | floating |
| selected n– well region | 9 ± 0.5 volts |
| unselected n– well region | floating |

The memory cell 30a(2) of the OR string 62a (page PG0) is programmed in a similar manner by applying the program voltage $V_P$ to the selected word line WL1 and grounding the unselected word line WL0. The remaining bias conditions are the same as described above with respect to programming the memory cell 30a(1).

Although the unselected n– well region 32(1) is floating, a small positive voltage may undesirably couple from the selected n– well region 32(0) to the unselected n– well region 32(1) via the selected bit line BL0. As explained below with respect to the embodiment of FIG. 4, this undesirable coupling between n– well regions 32 may be reduced by segmenting the bit lines of the array architecture along page boundaries.

Reading Operations

To read the selected cell 30a(1), the n– well regions of the array 60 are pulled to the supply voltage $V_{CC}$ via the respective well potential lines WP. The selected bit line BL0 is enabled for sensing by an associated sensing circuit (not shown for simplicity). All unselected bit lines BL1–BL3 are floating. The select gate line SG0 is grounded, thereby turning on the select transistor 64a. All other select gate lines SG1–SG3 are held at the supply voltage $V_{CC}$, thereby ensuring that the respective select transistors 64 coupled thereto remain off so as to isolate the unselected cells from the selected bit line BL0. The selected word line WL0 is pulled to the supply voltage $V_{CC}$. The unselected word line WL1 is grounded to allow the cell 30a(2) to conduct a channel current. All other unselected word lines WL2–WL7 are held at the supply voltage $V_{CC}$, thereby ensuring that the respective memory cells coupled thereto do not conduct a channel current.

The p+ source 36 and the control gate 46 of the selected memory cell 30a(1) are both at the supply voltage $V_{CC}$ and, therefore, the memory cell 30a(1) conducts a channel current only if there is charge present on its floating gate 42. Accordingly, in a programmed state, the memory cell 30a(1) couples the selected bit line BL0 to $V_{CC}$ which, in turn, is detected by the sense amplifier (not shown). As mentioned above, the cells 30 selected for reading conduct a channel current only if in a programmed state and, thus, do not suffer from the read disturb problems characteristic of conventional array architectures employing NMOS memory cells.

The bias conditions for reading the selected cell 30a(1) are summarized below in Table 2.

TABLE 2

Reading Voltages for Selected Cell 30a(1)

| node | voltage |
|---|---|
| SG0 | 0 |
| all other select gates | $V_{cc}$ |
| WL0 | $V_{cc}$ |
| WL1 | 0 |
| all other words lines | $V_{cc}$ |
| BL0 | sensed |
| all other bit lines | floating |
| all n– well regions | $V_{cc}$ |

The memory cell 30a(2) of the OR string 62a of page PG0 is read in a similar manner by coupling the selected word line WL1 to the supply voltage $V_{CC}$ and grounding the unselected word line WL0. The remaining bias conditions are the same as described above with respect to reading the memory cell 30a(1).

Erasing Operations

To erase the cells 30 within a page, the n– well region of that page is coupled to a high positive potential and the respective n– well regions of the other pages are floating. In this manner, the unselected pages are isolated from erasing operations on the selected page. All bit lines are floating. The select transistors 64 within the selected page are turned on, and a high negative voltage is applied to the respective control gates of the memory cells 30 of the selected page.

For instance, to erase the memory cells 30 of the page PG0, the well potential line WP0 is held at approximately 9 volts, and the well potential line WP1 is floating. The select gate lines SG0 and SG1 are grounded, thereby turning on the select transistors 64a and 64b, respectively. The word lines WL0–WL3 are held at approximately –9 volts. Under these bias conditions, electrons within the respective floating gates 42 of the cells 30 of the page PG0, repelled by the negative voltage on the word lines WL0–WL3 and attracted to the positive voltage on the selected n– well region 32(0), tunnel into the n– well region 32(0). In this manner, the cells 30 of the page PG0 are erased. Since the unselected n– well region 32(1) is floating, erasing of the cells 30 of the unselected page PG1 via electron tunneling is prevented. Accordingly, holding the unselected n– well region 32(1) at a floating potential, while the selected n– well region 32(0) is held at a high positive voltage, isolates the cells 30 of the unselected page PG1 from erasing operations of the selected page PG0.

In some embodiments, the select gate lines SG2 and SG3 of the unselected page PG1 are held at approximately 10.5 volts to prevent coupling between the bit lines and the cells 30 of the unselected page PG1. The word lines WL–WL7 of the unselected page PG1 are held at approximately 10.5 volts, thereby further isolating the cells of the unselected page PG1 from erasing operations on the selected page PG0.

The bias conditions used to erase the memory cells in the page PG0 of the array are summarized below in Table 3.

TABLE 3

Erasing Voltages (Page Erase)

| node | voltage |
|---|---|
| select gates of page PG0, i.e., SG0–SG1 | 0 |
| select gates of page PG1, i.e., SG–SG3 | 10.5 ± 0.5 volts |
| word lines of page PG0, i.e., WL0–WL3 | –9 ± 0.5 volts |
| word lines of page PG1, i.e., WL–WL7 | 10.5 ± 0.5 volts |
| selected n- well region | 9 ± 0.5 volts |
| unselected n- well region | floating or positive potential |
| all bit lines | floating |

Present embodiments allow for the erasing of a selected row, or byte, of cells. For instance, to erase the cells 30 in the first row of the page PG0, i.e., the row of cells 30 coupled to the word line WL0, the selected n– well region 32(0) is held at approximately 9 volts, while the unselected n– well region 32(1) is floating. The select gate line SG0 is grounded, while all other select gate lines SG1–SG3 are held at approximately 10.5 volts. The selected word line WL0 is held at approximately –9 volts, while the unselected word lines WL1–WL7 are held at approximately 10.5 volts. All bit lines are floating.

As discussed above, floating the unselected n– well region 32(1) prevents erasing of the cells 30 therein. The high negative voltage on the respective control gates 46 of the cells 30 in the selected row facilitates the erasing of those cells via electron tunneling. The high positive voltage on the respective control gates of the cells 30 within the other rows of the page PG0 prevents erasing of those cells. However, since the selected n– well region 32(0) is at approximately 9 volts, the cells 30 within unselected rows of the selected page PG0 may experience a slight loss of charge during erasing. Accordingly, it is preferable, for endurance considerations, to simultaneously erase all of the cells 30 in a page (page mode erase).

The threshold voltage $V_T$ of the cell 30, when in its intrinsic state, is between approximately –1.5 and –2.0 volts. In some instances, however, the above-described erasing operation may undesirably pull the threshold voltage $V_T$ of the cells 30 selected for erasing to a voltage more negative than –2 volts, thereby over-erasing the selected cells 30. When over-erasing occurs, it is necessary to return the threshold voltages $V_T$ of the over-erased cells 30 to between –1.5 and –2.0 volts. Otherwise, subsequent programming of these cells 30 may not fully charge the floating gates thereof. Further, the cells 30, when over-erased, may not properly conduct a channel current in response to a reading operation.

In accordance with the present invention, a "soft-programming" operation compensates for such over-erasing by returning the threshold voltage $V_T$ of the over-erased cells 30 to its intrinsic value of between approximately –1.5 and –2 volts. For instance, to soft-program the cell 30a(1), the selected bit line BL0 is held at between 0 and 2 volts, and the unselected bit lines BL1–BL3 are floating. The select gate line SG0 is grounded. All other select gate lines SG1–SG3 are held at a high positive voltage such as, for instance, 9 volts. The well potential line WP0 is held at a high positive voltage such as, for instance, 9 volts. The word line WL1 is grounded, thereby turning on the cell 30a(2) which, in turn, couples the p+ source 36 of the selected cell 30a(1)to the well potential line WP0, i.e., to approximately 9 volts. A programming voltage $V_P$, which in preferred embodiments ramps from approximately 3.5 volts to approximately 7 volts, is applied to the control gate of the cell 30a(1) via the selected word line WL0. The word lines WL2 and WL3 may be coupled to any suitable voltage.

Under these bias conditions, channel hot electrons (CHE) are injected into the floating gate 42 of the selected cell 30a(1). The resultant accumulation of negative charge on the floating gate 42 of the selected cell 30a(1) returns the threshold voltage $V_T$ thereof to between approximately –1.5 and –2.0 volts, thereby restoring the selected cell 30a(1) to its normal state. In this manner, over-erasing of the cells 30 is corrected. Preferably, this soft-program operation is performed immediately after completion of an erasing operation. The cell 30a(2) is soft-programmed in a similar manner by reversing the potentials applied to the word lines WL0 and WL1.

Since during these soft-programming operations a positive voltage, e.g., approximately 9 volts, is applied to the selected n– well region 32(0), and thus to the p+ source 36 of the cell 30a(2), the cell 30a(2) is much easier to turn on than is the cell 30a(1). Thus, it is preferable to soft-program the cell 30a(2) before soft-programming the cell 30a(1). Accordingly, in a similar manner, it is preferable to first soft-program the cell 30 of an OR string 62 closest to the select transistor of the OR string.

The voltages used in programming and erasing operations on the PMOS array 60 are lower than those typically used in programming and erasing NMOS memory devices. As a result, the cells 30 of the PMOS OR strings 62 are not required to sustain high junction voltages, thereby allowing for higher device density. In addition, the use of lower voltages in programming and erasing operations on the PMOS array 60 reduces power consumption.

The PMOS OR strings in accordance with the present invention may be included as part of various array architectures, including EEPROM and Flash EEPROM arrays. The process used to fabricate the PMOS OR strings of the present invention is the same, irrespective of the type of array architecture employed within, e.g., flash or EEPROM. Accordingly, present embodiments advantageously allow for not only the integration but also the simultaneous fabrication on the same chip of EEPROM and Flash EEPROM array which employ PMOS strings in accordance with the present invention.

As discussed above, during operation of the array 60, the selected n– well region 32(0) and the unselected n– well region 32(1) are held at different potentials to isolate the cells in the unselected page from operations on the selected page. Specifically, a floating potential is chosen for the unselected n– well region 32(1) of the array in order to prevent the potential applied to the selected n– well region 32(0) from coupling to the unselected n– well region 32(1). However, where a cell in a page unselected for erasing is subsequently selected for reading, the n− well region of that page must be brought from a floating potential to the supply voltage V$_{CC}$ before reading is commenced. The time required to charge the n− well region to V$_{CC}$ undesirably delays reading operations, thereby limiting the speed of the array 60.

Figure 4:
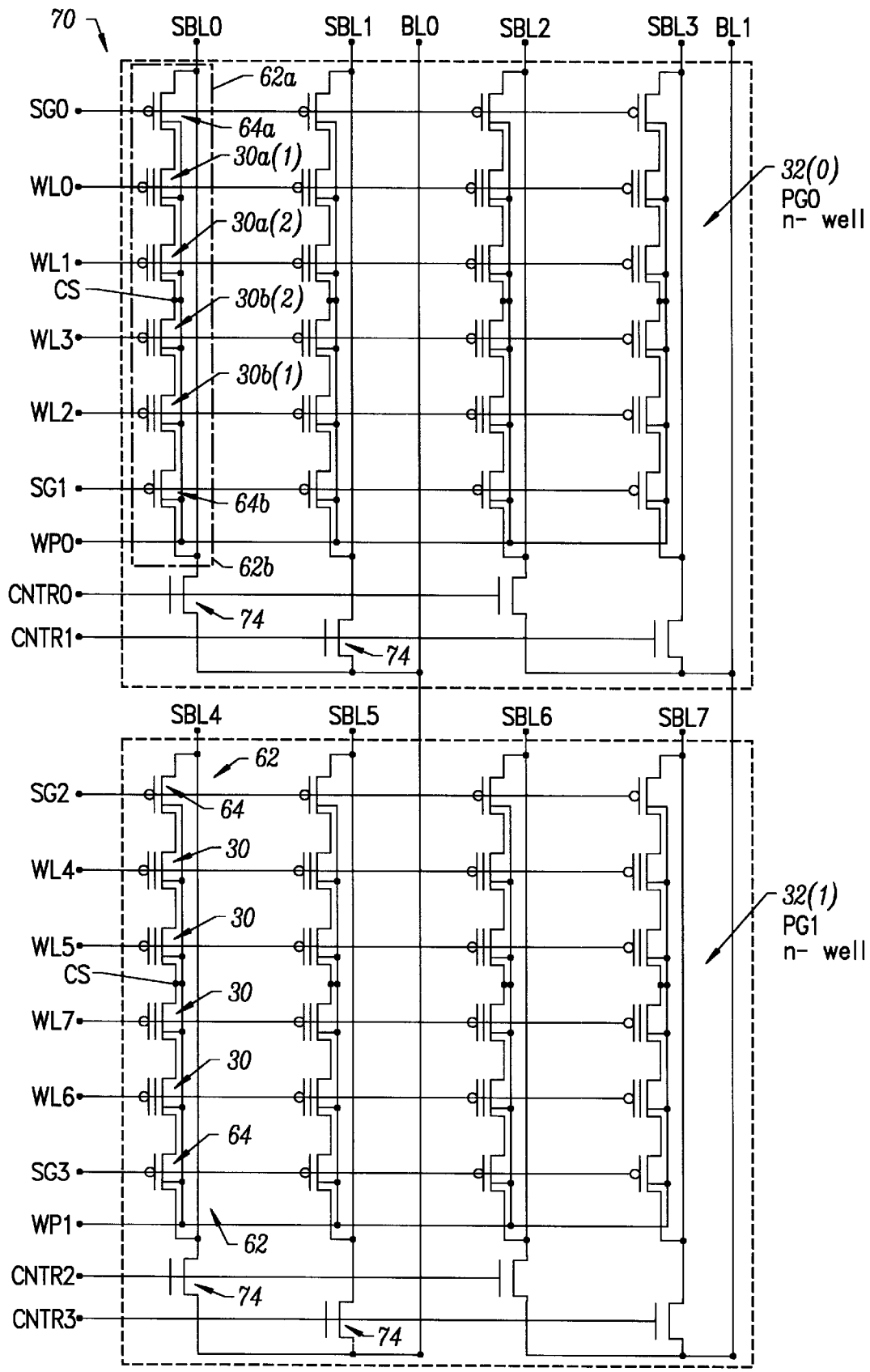
FIG. 4 is a schematic diagram of a PMOS array architecture in accordance with another embodiment of the present invention.

In another embodiment of the present invention, the bit lines are segmented along page boundaries to minimize coupling between the n− well regions. As explained below, segmenting the bit lines in such a manner increases speed. Referring to FIG. 4, an array 70 is shown to include two pages PG0 and PG1, where the columns of each page are formed by pairs of series-connected PMOS OR strings 62. A pair of the PMOS OR strings 62 is connected in parallel to a sub-bit line SBL. Pairs of sub-bit lines SBL in a page are connected to a "global" bit line BL by a pass transistor 74. The gates of the pass transistors 74 in alternating columns of a page are connected to a control line CNTR. In other embodiments, more than two sub-bit lines SBL may be coupled to a bit line BL via the pass transistors 74.

When accessing a cell 30 of the array 70, the pass transistor 74 corresponding to the cell 30 is turned on by applying a high positive voltage to the control line CNTR connected to that pass transistor 74. The other control lines CNTR are grounded to ensure that the respective pass transistors 74 coupled thereto remain off and thereby isolate the cells 30 in unselected columns from the selected bit lines BL. Where PMOS devices are used for the pass transistors 74, the bias voltages applied the control lines CNTR are reversed.

For example, to select the memory cell 30*a*(1) for either programming or reading, a positive voltage such as, for instance, 5 volts, is applied to the control line CNTR0, thereby coupling the sub-bit line SBL0 to the bit line BL0. The other control lines CNTR1–CNTR3 are grounded, thereby isolating cells 30 within the other columns of the page PG0 from the bit lines BL. The remaining bias conditions for programming and reading the memory cell 30*a* (1) are as discussed above with respect to the array 60 and shown in Tables 1 and 2, respectively.

When erasing the cells 30 of a selected page of the array 70, all of the control lines CNTR associated within that page are grounded so that the sub-bit lines within the selected page are floating. The remaining bias conditions for erasing are as discussed above with respect to the array 60 and shown in Table 3.

Segmenting the bit lines BL in the array 70 as described above and shown in FIG. 4 prevents coupling between the n− well regions via the bit lines. Thus, during operation of the array 70, the voltage on the selected n− well region is not coupled to the unselected n− well region. As a result, an unselected n− well region of the array 70 may be held at a finite positive potential instead of a floating potential, while still isolating the unselected page from operations on the selected page. Specifically, the n− well region of a page in the array 70 which is unselected for an erasing operation may be held at a potential suitable for reading operations, e.g., at the supply voltage V$_{CC}$. Accordingly, if the page is subsequently selected for reading, its n− well region is already at the desired potential for reading, i.e., V$_{CC}$. Thus, it is not necessary to charge the n− well region from a floating potential to V$_{CC}$ between erasing and reading operations. In this manner, the speed with which the cells 30 of the array 70 are read is improved, as compared to the array 60.

Further, segmenting the bit lines in the array 70 reduces the capacitance of the bit lines BL which, in turn, further improves the speed of the array 70. For instance, where it is desired to have a 4M memory array configured as a 2k by 2k matrix, the capacitance of each of the bit lines BL in the array 60 is approximately equal to 4 pF, and the capacitance of each of the bit lines BL in the array 70 is less than approximately 2 pF. Note, however, that inclusion of the sub-bit lines SBL and the associated pass transistors 74 increases silicon die area. Thus, where minimizing the die size of memory is of primary concern, the array architecture of FIG. 3 is preferable. Conversely, where maximizing the speed is of primary concern, the array architecture of FIG. 4 is preferable.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A PMOS memory array including a plurality of pages, each of said pages having a plurality columns comprising first and second PMOS OR strings, wherein:

said first PMOS OR string comprises:
      a first PMOS select transistor having a p+ drain coupled to a bit line of said array, a gate coupled to a first select gate line, and a p+ source;
      a first PMOS floating gate memory cell having a p+ drain coupled to said p+ source of said first PMOS select transistor, a control gate coupled to a first word line, and a p+ source; and
      a second PMOS floating gate memory cell having a p+ drain coupled to said p+ source of said first PMOS floating gate memory cell, a control gate coupled to a second word line, and a p+ source coupled to a common source node of said page; and said second PMOS OR string comprises:
      a second PMOS select transistor having a p+ drain coupled to said bit line, a gate coupled to a fourth select gate line, and a p+ source;
      a third PMOS floating gate memory cell having a p+ drain coupled to said p+ source of said second PMOS select transistor, a control gate coupled to a third word line, and a p+ source; and
      a fourth PMOS floating gate memory cell having a p+ drain coupled to said p+ source of said third PMOS floating gate memory cell, a control gate coupled to a second word line, and a p+ source coupled to said common source node.

2. The memory array of claim 1, wherein the PMOS OR strings within each of said plurality of pages are formed in an associated one of a plurality of n− well regions.

3. The memory array of claim 2, wherein within each of said plurality of pages, the n− well region is coupled to the common source node.

4. The memory array of claim 2, wherein said PMOS floating gate memory cells are programmed by channel hot electron injection.

5. The memory array of claim 2, wherein said PMOS floating gate memory cells are programmed by band-to-band tunneling induced hot electron injection.

6. The memory array of claim 1, wherein a selected one of said PMOS floating gate memory cells is programmed by applying a program voltage to the word line coupled to the selected cell, grounding the p+ drain of the selected cell, and applying approximately 9 volts to the p+ source of the selected cell.

7. The memory array of claim 6, wherein said program voltage ramps from a first potential to a second potential.

8. The memory array of claim 7, wherein said first potential is approximately 7 volts and said second potential is approximately 10.5 volts.

9. The memory array of claim 6, wherein said program voltage is between approximately 8 and 10 volts.

10. The memory array of claim 1, wherein a selected one of said PMOS floating gate memory cells is erased by applying a negative voltage to the word line coupled to the selected cell, floating the p+ drain of the selected cell, and applying approximately 9 volts to the p+ source of the selected cell.

11. The memory array of claim 10, wherein said negative voltage is approximately −9 volts.

12. The memory array of claim 1, wherein a selected page of the memory cells are erased by holding the n− well region of the selected page at a positive potential and holding the word lines of the selected page at a negative potential.

13. The memory array of claim 12, wherein said positive potential is approximately 9 volts and said negative potential is approximately −9 volts.

14. The memory array of claim 12, wherein unselected pages are isolated from erasing operations on the selected page by holding the n− well regions of the unselected pages at a floating potential.

15. The memory array of claim 1, wherein a selected one of said PMOS floating gate memory cells is read by coupling a supply voltage to the word line coupled to the selected cell and to the p+ source of the selected cell.

16. The memory array of claim 1, wherein a selected one of said PMOS floating gate memory cells is compensated for over-erasure by applying between approximately 0 and 2 volts to the p+ drain of the selected cell, applying a positive potential to the p+ source of the selected cell, and applying a soft-program voltage to the word line coupled to the selected cell.

17. The memory array of claim 16, wherein said soft-program voltage ramps from a first potential to a second potential.

18. The memory array of claim 17, wherein said first potential is approximately 3.5 volts and said second potential is approximately 7 volts.

19. The memory array of claim 1, wherein the bit lines are segmented along page boundaries to form sub-bit lines within each of the pages.

20. The memory array of claim 19, wherein the sub-bit lines are selectively coupled to a plurality of global bit lines.

* * * * *

UNITED STATES PATENT AND TRADEMARK OFFICE
CERTIFICATE OF CORRECTION

PATENT NO. : 5,909,392
DATED : June 1, 1999
INVENTOR(S) : Change et al.

It is certified that error appears in the above-identified patent and that said Letters Patent is hereby corrected as shown below:

Column 10, line 48, Claim 1, please replace "second" with --fourth--.

Column 10, line 39, claim 1, please replace "fourth" with -- second --.

Signed and Sealed this

Second Day of November, 1999

Attest:

Q. TODD DICKINSON

Attesting Officer

Acting Commissioner of Patents and Trademarks